United States Patent [19]

Ostoich et al.

[11] Patent Number: 4,720,687
[45] Date of Patent: Jan. 19, 1988

[54] FREQUENCY LOCKED LOOP WITH CONSTANT LOOP GAIN AND FREQUENCY DIFFERENCE DETECTOR THEREFOR

[75] Inventors: Vladimir E. Ostoich, San Jose; Thomas Hornak, Portola Valley, both of Calif.

[73] Assignee: Hewlett-Packard Company, Palo Alto, Calif.

[21] Appl. No.: 18,095

[22] Filed: Feb. 20, 1987

[51] Int. Cl.$^4$ .............................................. H03L 7/06
[52] U.S. Cl. ..................... 331/1 A; 331/11; 331/25; 307/526
[58] Field of Search ................. 331/1 A, 10, 11, 18, 331/25; 375/120; 329/50; 307/525, 526

[56] References Cited

U.S. PATENT DOCUMENTS 4,015,083  3/1977  Bellisio ............................. 375/120
4,456,890  6/1984  Carickhoff ........................ 331/10 X Primary Examiner—Eugene R. Laroche
Assistant Examiner—David Mis
Attorney, Agent, or Firm—Eugene H. Valet; Clifton L. Anderson

[57] ABSTRACT

A digital signal regenerator comprises a quantizer, a sampler, a timing extractor and a frequency and phase locked loop. The included frequency locked loop employs a frequency difference detector and a frequency generator which it shares with the included phase locked loop. The frequency difference detector includes flip-flops for generating square wave frequency difference signals, obviating the need for the multipliers, comprators and low pass filters used in prior devices. In addition, the frequency difference detector includes pulse-width modulator which is controlled by a pulse-width regulator. The regulator provides for a constant loop gain for the frequency locked loop over different reference frequencies output by the frequency generator.

19 Claims, 2 Drawing Figures

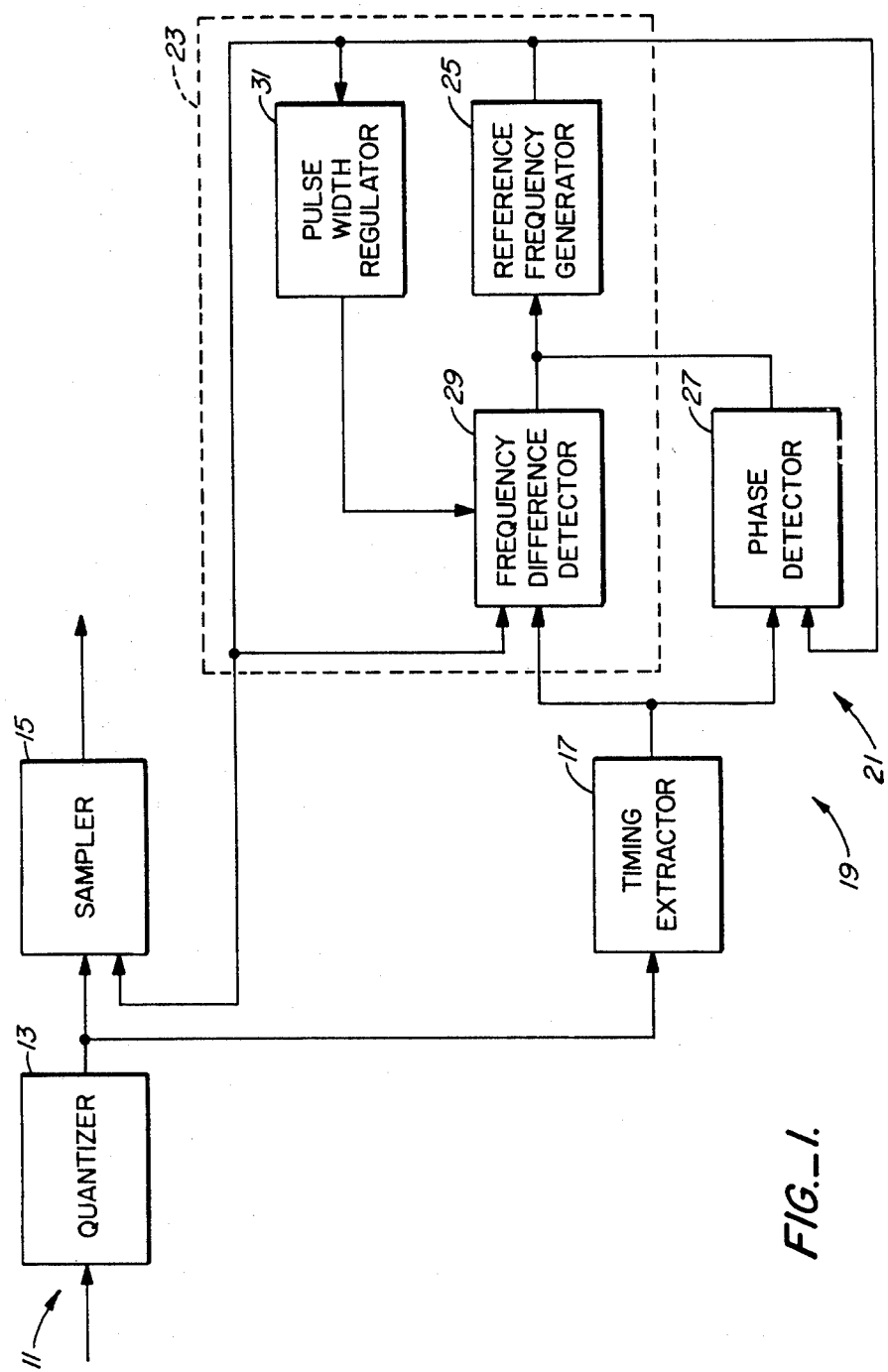
FIG._1.

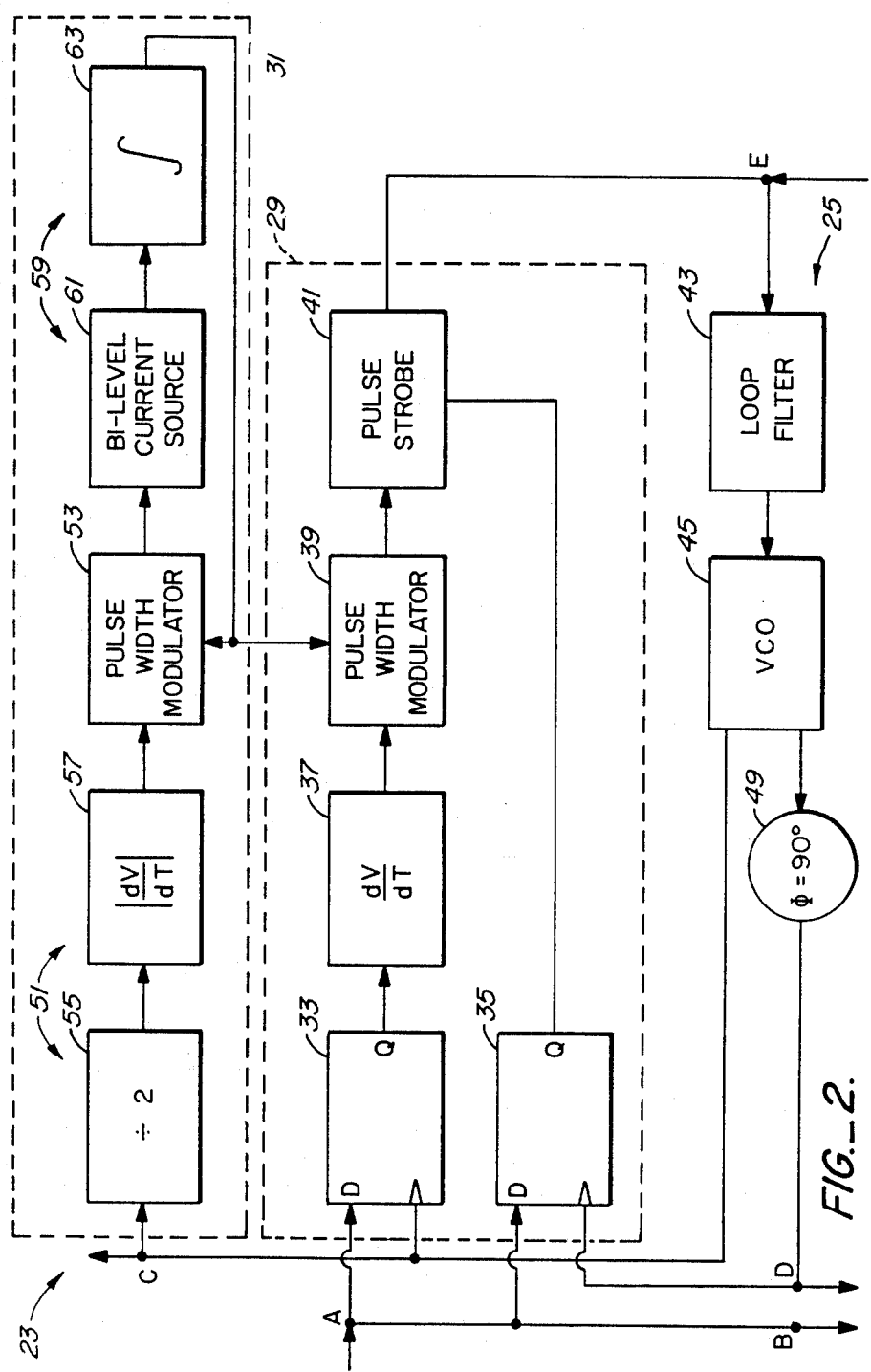
FIG._2.

FREQUENCY LOCKED LOOP WITH CONSTANT LOOP GAIN AND FREQUENCY DIFFERENCE DETECTOR THEREFOR

BACKGROUND OF THE INVENTION

The present invention relates to digital signal processing, and, more particularly, to a frequency locked loop and a frequency difference detector as implemented, for example, in a digital data regenerator.

Digital signals are widely used in telecommunications in the transmission of, for example, multiplexed pulse code modulated (PCM) voice channels over twisted pair, coaxial cable or optical media. These digital transmission rely on regularly spaced regenerators to reconstruct the data stream by cancelling the effects of loss, dispersion and noise in the transmission medium before these effects become irreversibly large. The operation of regenerators can be generalized from the following description pertaining to simple binary data, e.g., unipolar no-return-to-zero (NRZ) data.

A digital binary signal originates as a bi-level step function with sharply defined transitions and a consistent bit rate. This well-defined form is eroded by loss, dispersion and noise during transmission. Upon reception, the degraded signal can be amplified and limited or can be applied to a comparator, or other decision-making circuit, to yield again a two-level signal with sharp transitions. However, the restored transitions do not generally match the original transition times. The new transitions tend to "jitter", i.e., vary randomly about the nominal transition time.

Basic regeneration strategies to sample the resharpened signal on a clock transition coinciding with the midpoint of a bit period so as to minimize the effects of this jitter. The challenge is to determine the proper clock signal from the data stream itself.

While the frequency spectrum of the bit stream has a null at the baud frequency, reliable timing information exists in the data transitions. This timing can be extracted by differentiating the re-sharpened signal to yield a train of pulses of alternating polarity, which can be rectified to provide a timing signal in the form of a train of uniform-polarity pulses identifying data transitions.

If the incoming data were in the form of alternating zeroes and ones, this timing signal would have a pulse rate equal to the baud rate of the incoming data. More often, the timing signal takes the form of a pulse train with such a pulse rate, but with randomly selected pulses missing.

For example, random data reproduces a transition pulse waveform that looks like a pulse train at the baud frequency with missing pulses. Such a pulse stream has a verty strong spectral component at the baud frequency. With the proper filtering, amplification, and phase shifting the baud frequency component in the transition pulse spectrum can be processed into the clock signal required to regenerate the incoming data.

A phase locked loop can lock onto a very small spectral component in a pulse train so that long strips of ones or zeroes have negligible effect on timing phase or amplitude. Thus, a phase locked loop can be used to fill in the missing pulses in a pulse train and eliminate jitter.

Conventional phase locked loops require a design trade-off between stability and capture range. This limitation has been partially overcome by the substitution of frequency/phase locked loops. These devices use a frequency locked loop during an acquisition mode when capture range is the primary concern. Once the proper frequency is locked, the loop is dominated by a parallel phase locked loop, which provides stability during steady-state mode operation.

Such frequency/phase locked loops are disclosed in U.S. Pat. No. 4,015,083 to Bellisio and in R. R. Cordell et al., "A 50 MHz Phase- and Frequency-Locked Loop", IEEE Journal of Solid-State Circuits, VOL. SC-14, No. 6, December 1979, pp. 1003-1009. In these disclosures a phase locked loop and a frequency locked loop share a loop filter, a controlled oscillator and a phase shifter. The phase locked loop is conventional and includes a multiplier and a low pass filter. The frequency locked loop includes a frequency difference detector, and a filter.

The outputs of the respective filters are summed and conveyed to the shared loop filter. The gains of the two loops are such that the frequency locked loop dominates the controlled oscillator during acquisition until frequency lock is achieved. Once frequency lock is achieved, the phase locked loop dominates to attain and maintain phase lock.

Referring to the Bellisio patent, the frequency difference detector includes parallel in-phase and quadrature branches. The in-phase branch includes a multiplier at which an extracted timing signal is multiplied by an in-phase version of the oscillator output. A low pass filter rejects the upper sideband to yield a signal at the difference, i.e., "beat", frequency of the multiplier inputs. A comparator converts the beat signal into a square wave at the beat frequency. A differentiator then converts this square wave into a train of alternating polarity pulses having a pulse rate twice the beat frequency.

The quadrature branch of the frequency difference detector also includes a multiplier, a low pass filter and a comparator. The inputs to this multiplier are the extracted timing signal and a phase-shifted version of the oscillator output. The multiplier, the low pass filter, and the comparator of the quadrature branch perform the same functions as their counterparts in the in-phase branch, in this case yielding a square wave at the same beat frequency, but 90° out-of-phase with respect to the square wave in the in-phase branch. The quadrature branch also includes a capacitor or other means for eliminating any non-zero DC component of the quadrature square wave.

The alternating polarity pulse train output from the in-phase branch is multiplied by the ac-coupled quadrature square wave from the square-wave branch to yield a consistent polarity pulse train. The pulse rate of this train is twice the difference frequency of the timing signal and oscillator output; the sign of the polarity represents the sign of the frequency difference. For example, if the timing frequency exceeds the oscillator frequency, the output of the frequency detector has a positive polarity, and the polarity is negative under the opposite circumstances.

While rapid and wide-range acquisition and good stability can be achieved for a given nominal baud rate, the disclosed system does not provide optimally for self-timed regeneration of signals with widely differing baud rates. A reason for the limited baud rate of frequency locked loops is that the components required to provide a proper balance of acquisition range and speed on the one hand, and stability on the other hand are baud-rate dependent.

A very limited solution to this problem has been to arrange a regeneration system so that the necessary components of the frequency difference detector can be readily replaced. For example, the low pass filters and a pulse-width determining capacitor of the differentiator of the frequency difference detector can be arranged for ready replacement when the frequency locked loop is used at different baud rates.

Whereas most of a regeneration system can be and should be implemented on a single chip to provide enhanced performance and reliability at lower cost, the components needing replacement are typically left off-chip. While the off-chip components may include only a few capacitors and such per regenerator, the off-chip components amount to a multiplier of parts count for large multi-regenerator systems. Also, manufacturing costs increase and reliability goes down with the increased parts count. For many applications, especially satellite communications, bulk and power consumption are adversely affected by discrete components.

What is needed is a frequency locked loop with both rapid and wide-range acquisition and optimal stability which can be used for a broad range of nominal baud rates. In particular, a frequency difference detector for such a frequency locked loop is needed which minimizes the component replacement required to optimize performance at different baud rates.

SUMMARY OF THE INVENTION

A frequency locked loop is provided with a substantially constant steady-state loop gain over a broad range of nominal operating frequencies, i.e., baud rates in a data regeneration system.

The frequency spectrum of a train of transition pulses based on random data has several spectral components nearby the desired frequency component at the baud rate. For this reason, a regenerators's reference frequency oscillator must have a well-defined center frequency close to the baud rate, and its tuning range must be constrained to a limited range of frequencies within, for example 10%, of the baud rate. This guarantees that the phase/frequency locked loop does not lock to an undesired frequency in the transition pulse spectrum.

A reference oscillator with a well-defined center frequency and limited tuning range can be, for example, a voltage controlled LC oscillator, as used in the Bellisio patent. An LC oscillator can be tuned to widely different baud rates by applying different LC tank circuits to it. This happens, for example, when a prefabricated and stocked frequency/phase locked loop (or an incorporating regenerator) is used in links with widely different baud rates.

When a voltage controlled LC oscillator in a regenerator is re-tuned by changing its frequency determining tuning elements, its absolute control sensitivity changes proportionally with the baud rate. (The absolute control sensitivity is expressed as frequency change per voltage change, e.g., Hertz/volts.) The present invention addresses the effect of changes in absolute control sensitivity on loop gain.

The expression for loop gain in a frequency locked loop includes the product of the absolute control sensitivity of the reference oscillator and the absolute detection sensitivity of the frequency difference detector. (The absolute detection sensitivity of the frequency difference detector is expressed as the change in detector output voltage per change in its input frequency, e.g., in volts/Hertz.) In a conventional frequency locked loop, with no component replacement, the frequency difference detector's absolute detection sensitivity is constant at different baud rates, so that when the oscillator's elements are changed, loop gain varies with the oscillator's control sensitivity. The result is that, outside a relative narrow baud-rate range, loop gain significantly deviates from a desired balance of loop stability and acquisition speed when the reference oscillator's frequency determining elements are exchanged to accommodate a significantly different baud rate.

To provide constant loop gain, and thus optimal frequency locked loop performance over a wide range of different baud rates, the product of absolute sensitivities of the oscillator and the detector must be kept constant. This requires the absolute detection sensitivity to vary inversely with the absolute oscillator control sensitivity, and thus inversely with respect to the baud rate. This occurs when the fractional detection sensitivity of the frequency difference detector is constant. In accordance with the present invention, for a given fractional difference between the input frequency and the frequency of the reference signal established by the frequency locked loop, the error signal generated by the frequency difference detector is substantially the same over a wide range of baud rates.

This characteristic is preferably implemented by modifying the pulse width in the frequency difference detector as a function of the reference frequency. Changes in pulse width are important when the reference oscillator is tuned to significantly different nominal frequencies by using different tuning elements. The change in pulse width in response to the relatively small changes (a few percent) of reference frequency during the acquisition is relatively insignificant. Another approach is to incorporate in a frequency locked loop a device in which the gain varies inversely as the frequency of the loop output. Additionally, combinations of the foregoing approaches can be employed.

In one realization of the present invention, a frequency difference detector includes a pulse-width modulator which is controlled by feedback from the output of the frequency locked loop. The feedback signal is processed by a pulse-width regulator. The pulse-width regulator internally generates a pulse train with a rate corresponding to the output frequency of the frequency locked loop.

The pulse-width regulator includes a calibration pulse generator, its own pulse-width modulator, and a duty-cycle detector. The pulse generator converts the reference signal output from the frequency generator into a train of uniform polarity pulses having a repetition rate equal to the reference frequency. The eventual width of these pulses is controlled by the regulator's pulse-width modulator.

The duty-cycle detector is arranged in a feedback relation with the regulator's pulse-width modulator to ensure that the internally generated pulses are a fixed fractional duration of the bit period, e.g., half the bit period. The same control signal can be fed to the frequency difference detector's pulse-width modulator where its effects are scaled appropriately for the difference frequencies. Pulse width is varied inversely with respect to reference frequency; in other words, the pulse width is varied to maintain a fixed multiple of the reference period. This ensures a substantially constant loop gain over the intended range of reference frequencies.

The desired pulse-width variation is effected in a preferred frequency difference detector which includes in-phase and quadrature branches with respective D-type flip-flops, or functional equivalents thereof, for generating square waves at the beat frequency. The data inputs of both flip-flops are driven by the extracted timing signal. Phase-staggered versions of the reference signal are used to clock the respective flipflops so that the generated square waves are out-ofphase with respect to each other. The use of the flipflops to generate the square waves obviates the need for a low pass filter which might otherwise need replacement for different baud rates.

Thus the present invention provides for automatically optimized frequency locked loop operation over a wide range of baud rates and for fuller utilization of integrated circuit technology and the advantages in cost, performance and reliability afforded thereby. Other features and advantages of the present invention are apparent from the description below with reference to the following drawings.

BRIEF DESCRIPTION OF THE DRAWINGS

FIG. 1 is a functional block diagram of a digital data regenerator in accordance with the present invention.

FIG. 2 is a functional block diagram of a frequency locked loop with a frequency difference detector in accordance with the present invention.

DESCRIPTION OF THE PREFERRED EMBODIMENTS

A digital data regenerator 11 includes a quantizer 13, a sampler 15, a timing extractor 17, and a frequency/phase locked loop 19. In the frequency/phase locked loop 19, a phase locked loop 21 and a frequency locked loop 23 share a common reference frequency generator 25. The phase locked loop 21 includes a phase detector 27, and the frequency locked loop 23 includes a frequency difference detector 29. In accordance with the present invention, the frequency locked loop 23 also includes a pulse-width regulator 31 for controlling the pulse-width characteristic of the frequency difference detector 29 as a function of the frequency of a reference signal provided by the frequency generator 25.

The regenerator 11 operates as follows. A presumably degraded input signal is input to the quantizer 13. The quantizer 13 can include an amplifier and a limiter or a comparator to reshape the degraded signal so that errors are confined primarily to the timing of the transitions, i.e., jitter.

The purpose of the sampler 15, which can be a simple D-type flip-flop, is to sample the reshaped signal at the center of each bit period at the original bit rate. By sampling at the center of each bit period, the effects due to jitter, if not too large, can be eliminated. Thus, theoretically, the regenerated signal can replicate the data and timing of the original transmission. The remaining illustrated components are designed to provide the desired clocking for the sampling operation.

The timing extractor 17 provides a pulse train marking data transitions in the quantized signal, which it receives in parallel with the sampler 15. To this end, the timing extractor 17 preferably includes a differentiator, a full-wave rectifier, and preferably a pulse-width modulator. The differentiator marks each transition in the quantized signal with a pulse of corresponding polarity. Uniform polarity is then imposed by the full-wave rectifier. Pulse width is constrained by the pulse-width modulator to be half, for example, the pulse period.

Although the corresponding feedback line is not shown, pulse-width control for the timing extractor 17 is provided by the pulse-width regulator 31. The pulse-width regulator 31 replicates the components and arrangement of the timing extractor 17; thus, the operation and structure of the timing extractor 17 can be understood more thoroughly in conjunction with the subsequent more detailed description of the pulse-width regulator 31.

In steady state, the timing extractor 17 provides a timing signal that can be characterized as a square wave with some of its squares missing. Such a wave has a strong enough spectral component at the incoming baud rate to drive the frequency/phase locked loop 19.

The extracted timing signal is directed in parallel to the phase detector 27 and the frequency difference detector 29. The phase detector 27 is linked in a feedback relationship to the frequency generator 25 to constitute the phase locked loop 21, while the frequency difference detector 29 is linked in a feedback relationship with the frequency generator 25 to define the frequency locked loop 23. Also, the frequency difference detector 29 is linked to the frequency generator 25 in a pulse-width control loop via the pulse-width regulator 31.

The frequency locked loop 23 is shown in greater detail in FIG. 2. The extracted timing signal arrives via node A from the timing extractor 17 and is input from node A to the frequency locked loop 23; the extracted timing signal is also directed to the phase detector 27 via node B. The reference signal output of the frequency locked loop 23 is directed back to the frequency difference detector, as well as to the sampler 15 via node C, and a phase shifted version of the reference signal is fed back to the frequency difference detector and is also directed to the phase detector via node D. The output of the phase detector 27 is summed with the output of the frequency difference detector 29 via node E.

The frequency difference detector 29 includes an "in-phase" D-type flip-flop 33, a "quadrature" D-type flip-flop 35, a differentiator 37, a pulse-width modulator 39, and a pulse strobe 41. The frequency generator 25 includes a loop filter 43, a voltage controlled oscillator 45 and a phase shifter 49. The pulse-width regulator 31 comprises a calibration pulse generator 51 including a frequency divide-by-two circuit 55 and a combination differentiator/rectifier 57, a pulse width modulator 53, and a duty-cycle detector 59 including a bi-level current source 61 and an integrator 63.

The "in-phase" D-type flip-flop 33 of the frequency difference detector 29 serves to generate a square-wave, with some squares missing, having a fundamental frequency equal to the difference between that of the frequency of the extracted timing signal and the reference frequency. This is accomplished by directing the timing signal to the data input of the flip-flop 33, and directing the reference signal, to the clock input of the flip-flop 33.

Since the extracted timing signal is derived from a data-type signal, as opposed to a clock, it is not periodic. Nonetheless, it can be characterized by the frequency that it would have were the data a string of alternating ones and zeroes. This frequency is equal to the baud rate.

The square wave difference signal from the output of the in-phase flip-flop 33 is then converted to a train of constant width pulses of alternating polarity, each pulse marking a transition in the square wave difference signal. The transition marking is performed by the differentiator 37.

Herein, the term "differentiator" refers to a device which marks square-wave transitions with pulses the polarity of which correspond to the sense of the transitions marked. An additional limitation that the differential of a square wave have a zero volt DC offset is not applied herein.

The final width of the pulse from the frequency difference detector 29 is imposed by the pulse-width modulator 39. While the pulse-width modulator 39 is shown between the differentiator 37 and the pulse strobe 41 of the frequency difference detector 29, the pulse-width modulator 39 could be implemented elsewhere.

As alternatives to the illustrated location, the pulse-width modulation function could be integrated with the differentiator or with the pulse strobe, or imposed after the pulse strobe and before the loop filter of the frequency generator. The determination of the pulse width to be imposed is a function of the pulse-width regulator, to be described in greater detail below.

The function of the pulse strobe 41 is to convert the train of alternating polarity pulses into a train of uniform polarity pulses, the polarity indicating the sign of the frequency difference between the timing signal and the reference signal. This can be effected by opening and closing a switch at the beat frequency so as to allow every pulse of one polarity to pass and to discard every pulse of the other polarity. The pulse rate is then equal to the beat frequency. Alternatively, the "rejected" pulses can be routed through an inverter and returned to their positions in the stream so that the pulse rate is twice the beat frequency.

In either case, it is desirable to switch the strobe 41 out-of-phase with the pulses. A strobe control signal can be readily generated in the form of a phase-shifted square wave at the beat frequency by means of the quadrature flip-flop 35. As with the in-phase flip-flop 33, the extracted timing signal is directed to the data input, but the reference signal input to the clock input is via the phase shifter 49.

By using the output of the quadrature flipflop 35 as the strobe control signal, the desired strobe timing is achieved. When the timing signal's frequency exceeds the reference frequency, the strobe 41 permits the positive-going pulses to pass; the negative going pulses are either discarded or inverted. When the timing signal's frequency is less than the reference frequency, the strobe 41 permits the negative going pulses to pass; the positive-going pulses are either discarded or inverted.

The resulting error signal consisting of the uniform polarity pulse train is integrated by the loop filter 43, which provides a substantially DC voltage to the voltage controlled oscillator 45. The reference frequency increases with a one polarity of the applied voltage, and decrease with the opposite polarity of the applied voltage, as required to more closely synchronize with the timing signal.

As the frequency discrepancy decreases, the beat frequency and the pulse rate of the frequency difference detector 29 decreases. The effect is to decrease the DC component of the signal at the input of the loop filter 43, thus decreasing the rate of reference frequency change. As the voltage output from the frequency difference detector 29 drops below a predetermined threshold, the phase locked loop 21 dominates the oscillator 45 to effect phase locking.

In prior art devices, the width of pulses generated by a frequency difference detector is a constant dependent on the characteristics of the differentiator. Consequently, the DC component applied to the loop filter is simply a function of the absolute difference of the timing signal frequency and the reference frequency. Thus, a frequency locked loop with gain optimized for a given baud rate would not be optimized for baud rates an order of magnitude higher or lower than the given baud rate.

The present invention provides for maintaining the optimized loop gain across a wide range of baud rates. In other words, at different frequencies, equal fractional differences in frequency induce substantially equal error signals applied to the loop filter 43.

In the illustrated embodiment, the constant steady-state loop gain is implemented by the pulse-width regulator 31. The pulse-width regulator 31 comprises the calibration pulse generator 51, the pulse-width modulator 53 and the duty-cycle detector 59 in feedback relationship with the pulse-width modulator 53. The phrase "steady-state loop gain" is used to characterize gain at or near frequency lock. It is not critical to preserve the, generally non-constant, gain substantially remote from the frequency lock.

The calibration pulse generator 51 includes the differentiator/rectifier 57 preceded by the frequency divide-by-two circuit 55. The frequency divide-by-two circuit 55 accepts the in-phase reference signal at its input and generates a square-wave at half the reference frequency. The transitions in this square wave are marked, as in the timing extractor 17, by the differentiator/rectifier 57 to yield a train of calibration pulses of uniform polarity. The repetition rate of this train equals the reference frequency.

The differentiator/rectifier 57 can be an integrated device, or a differentiator, which produces pulses of alternating polarity at each transition followed by a separate full-wave rectifier. Again, the output of the differentiator can have a non-zero DC component. The full-wave rectifier rectifies polarity, yielding a train of uniform polarity pulses with a pulse rate equal to the frequency of the reference signal.

The eventual width of the calibraton pulses is determined by the pulse-width modulator 53 in response to a feedback signal from the duty-cycle detector 59. The duty-cycle detector 59 includes the bi-level current source 61 and the integrator 63.

The bi-level current source 61 is designed to output a first current level during a pulse and a second current level between pulses. In the illustrated embodiment, the two output levels have equal magnitudes and opposite polarity, and in this sense the bi-level current source 61 is a bi-polar current source.

When the pulse width is half of a pulse period, the average output of the current source is zero. The zero current input to the integrator 63 yields a constant voltage output, which in turn yields a constant pulse width as imposed by the regulator's pulse-width modulator 53. Thus a 50% duty cycle represents a steady-state condition.

At any other duty cycle, the average output of the current source 61 is other than zero, so the output of the integrator 63 is changed until the pulse-width is again half of the pulse period. The response characteristics of the pulse-width modulator 53 and the duty-cycle detector 59 define a negative feedback loop. The effect of the loop as set in the illustrated embodiment is to force a 50% duty cycle by modulating the pulses to the corresponding width.

As indicated above, the differentiator/rectifier 57 and the pulse-width modulator 53 of the pulse-width regulator 31 are matched to corresponding components in the timing extractor 17. Since the pulse-width modulator of the timing extractor receives the same control signal as the pulse-width modulator 53 of the pulse-width regulator 31, the pulse width of the timing extractor 17 is also forced to half the reference period. This ratio guarantees that the outputs of the flip-flops 33 and 35 have 50% duty cycles. This also ensures that the reference signal transitions occur at the proper instant for sampling the incoming data "mid-bit".

The control voltage output from the integrator 63 is also directed to the frequency difference detector's pules-width modulator. Since the control voltage forces the regulator pulse width to be a fixed proportion of the reference signal's period, e.g., half, it can be used to force the frequency difference detector's pulse width to be a fixed proportion of the reference signal's period.

In the case of the frequency difference detector 29, the proper proportion can be on the order of several-to-one, rather than half since the period of a difference signal is much longer than the corresponding reference period. Thus, if we assume a maximum 10% difference between the data rate and reference frequency, the maximum beat frequency is one tenth of the data rate and the detector's pulse-width modulator 39 should be designed to generate about ten times wider pulses than the matched modulators of the pulse-width regulator 31 and the timing extractor 17. This ratio is then automatically maintained over a large range of baud rates.

Since this arrangement provides for a detector pulse width which is a fixed multiple of the reference period, steady-state loop gain has the same value when different baud rates are accommodated by changing the reference oscillator's frequency determining elements. Thus, optimal performance can be maintained over a wide range of baud rates without component replacement in the frequency difference detector. As indicated above, the low pass filters which required replacement in the prior art devices are eliminated in favor of the flip-flops. Differentiator component replacement is rendered unnecessary by the pulse-width modulator. Thus enhanced integration is provided for by the present invention.

Since many of the illustrated components are presented in functional form, it is clear to those skilled in the art that many well-known devices can be used to implement these components. Furthermore, many know rearrangements can be used to effect comparable functions. As indicated above, the pulse-width modulators can be integrated with one or more of the neighboring devices or be arranged as separate entities.

For example, an alternative embodiment employs a frequency difference detector including a true differentiator (zero volts DC offset), a multiplier for the pulse strobe, and a capacitor or other AC coupling means between the quadrature flip-flop and the multiplier to yield the desired pulse train at the frequency difference detector output. In addition, the frequency divide-by-two circuit in the pulse-width regulator is dispensed with and the full-wave rectifier is replaced by a half-wave rectifier. The parameters of the corresponding components in the timing extractor are adjusted to the appropriate ratios for sampling purposes.

The present invention can be applied to a wide range of signal processing environments, frequency ranges, applications, and technologies. The parallel phase locked loop, the timing extractor, the sampler and the quantizer can be implemented in different ways, or even dispensed with. Other variations and modifications are provided for by the present invention, the scope of which is limited only by the following claims.

What is claimed is:

1. A frequency locked loop comprising:
   a frequency difference detector arranged to receive an input signal and a reference signal, said input signal with an input frequency and said reference signal with a reference frequency, said frequency difference detector being adapted to provide an error signal reflecting the difference in frequency between said input signal and said reference signal;
   a frequency generator for providing said reference signal, said frequency generator being arranged in feedback relation with said frequency difference detector so that the frequency of said reference signal changes in a direction selected to diminish the magnitude of the detected difference in frequency; and
   gain compensation means for causing said error signal to be substantially constant over different reference frequencies for fixed fractional differences between said input frequency and said reference frequency.

2. The frequency locked loop of claim 1 wherein said frequency detector includes a flip-flop having a data input and a clock input, said flip-flop being arranged to receive said input signal at one of said inputs and said reference signal at the other of said inputs so that a difference signal is output from said flip-flop having a srong spectral component at the difference of said input frequency and said reference frequency.

3. The frequency locked loop of claim 1 wherein said frequency difference detector includes transition marking means for converting said difference signal into a train of pulses of alternating polarity, each pulse corresponding to a transition in said difference signal, said frequency difference detector including pulse-width modulation means for modulating the width of pulses generated by said transition marking means in response to a control signal provided by said gain compensation means.

4. The frequency locked loop of claim 1 wherein said error signal is a pulse train of uniform polarity and pulse width, said gain compensation means including pulse-width control means for controlling pulse width as a negatively correlated function of reference frequency.

5. A frequency locked loop comprising:
   means for receiving an input signal characterized by an input frequency;
   a frequency generator for generating a reference signal characterized by a reference frequency and period;
   a frequency difference detector, in feedback relation to said frequency generator and arranged to receive said input signal, for providing an error signal comprising a train of uniform-width pulses, the repetition rate of said pulse train reflecting the difference between said input frequency and said reference frequency, said frequency difference detector including a pulse-width modulator having a control input;

a pulse-width regulator for controlling the width of pulses output by said frequency difference detector, said pulse-width regulator being responsive to said reference frequency and being arranged to provide a control signal to said control input of said pulse-width modulator so that the width of pulses output by said frequency difference detector negatively correlates with said reference frequency.

6. The frequency locked loop of claim 5 wherein said frequency difference detector includes a first flip-flop having a data input and a clock input, said first flip-flop being arranged to receive said input signal at one of said inputs and to receive said reference signal at the other of said inputs so as to provide a bi-level signal having well-defined transitions and a frequency equal to the difference between said input frequency and said reference frequency.

7. The frequency locked loop of claim 6 wherein said frequency difference detector includes a transition marker arranged to receive said bi-level signal, said transition marker producing a train of pulses marking each transition time of said bi-level signal, said transition marker including a pulse-width modulator with a control input for controlling the width of said pulses in response to said control signal, said pulse-width modulator being arranged to receive said control signal from said pulse-width regulator.

8. The frequency locked loop of claim 6 wherein said frequency difference detector includes a transition marker arranged to receive said bi-level signal, said transition marker producing a train of pulses marking each transition time of said bi-level signal, said train with pulses of constant width and of alternating polarity.

9. The frequency locked loop of claim 8 wherein said frequency difference detector includes pulse-width modulator having a pulse input and a control input, said modulator being arranged to receive pulses generated by said transition marker at its pulse input and a control signal from said pulse-width regulator at its control input.

10. The frequency locked loop of claim 9 wherein said frequency difference detector includes a pulse strobe for providing said error signal, said pulse strobe having a signal input and switch control input, said pulse strobe being arranged to receive pulses from said pulse-width modulator, the pulse rate of said error signal reflecting the magnitude of the difference between said input frequency and said reference frequency and the pulse polarity of said error signal polarity reflecting the sign of the difference between said frequencies.

11. The frequency locked loop of claim 10 wherein said frequency generator includes a phase shifter for producing a phase-shifted reference signal with the reference frequency and having a phase different from said reference signal, and wherein said frequency difference detector includes a second flip-flop having a data input and a clock input, said second flip-flop being arranged to receive said input signal at one of its said inputs and to receive said phase-shifted reference signal at the other of its said inputs so as to produce at its output a phase-shifted beat signal having the same frequency as said bi-level signal and having a phase different therefrom, said phase-shifted beat signal being directed to the switch control input of said pulse strobe so as to provide for the uniform polarity of said error signal.

12. The frequency locked loop of claim 5 wherein said pulse-width regulator includes:
a pulse generator for generating a train of calibration pulses with a pulse rate equal to said reference frequency, said pulse generator being arranged to receive said reference signal;
a calibration pulse-width modulator for modulating the width of said calibration pulses in response to a calibration pulse-width control signal, said calibration pulse-width modulator being arranged to receive said calibration pulses from said pulse generator, said calibration pulse-width modulator having an input for a pulse-width control signal; and
a duty-cycle detector for providing a pulse-width control signal as a function of the quotient of an calibration pulse width divided by the calibration pulse period.

13. The frequency locked loop of claim 12 wherein said pulse generator includes a transition marker for marking each transition of said calibration pulse train wave with a pulse so as to produce a train of calibration pulses of alternating polarity and with a pulse rate equal to twice the reference frequency, said pulse generator further including a half-wave rectifier to generating a pulse train of uniform polarity at said reference frequency.

14. The frequency locked loop of claim 12 wherein said pulse generator includes:
a frequency divide-by-two circuit arranged to receive said reference signal, said frequency divide-by-two circuit providing a calibration square wave with a frequency half that of said reference frequency; and
a transition marker for marking each transition of said calibration square wave with a pulse so as to produce a train of calibration pulses with a calibration pulse rate equal to said reference frequency.

15. The frequency locked loop of claim 14 wherein said transition marker further comprises a full-wave rectifier for rectifying calibration pulses originally generated with alternating polarity.

16. The frequency locked loop of claim 12 wherein said duty-cycle detector includes a bi-level current source and an integrator, said bi-level current source being arranged so that its control input can receive pulse-width modulated calibration pulses, said integrator being arranged to integrate the output of said bi-level current source over time to generate said pulse-width control signal, said calibration pulse-width modulator and said frequency difference detector pulse-width modulator being arranged to receive said pulse-width control signal at the respective control signal inputs thereof.

17. A frequency difference detector comprising:
a flip-flop having a data input, a clock input and an output, said flip-flop being arranged to receive an input signal characterized by an input frequency at one of said inputs and a reference signal characterized by a reference frequency at the other of said inputs, said flip-flop being adapted for providing a bi-level signal characterized by a frequency equal to the difference of said input frequency and said reference frequency;
a transition marker arranged for receiving said bi-level signal and for providing a train of pulses of alternating polarity therefrom;
a pulse-width modulator arranged for modulation of the width of said pulses in response to a control signal, said modulator having a control input for receiving a control signal; and a pulse strobe for providing a train of pulses of uniform polarity from said train of pulses of alternating polarity, the pulse rate of said train of uniform polarity pulses reflecting the difference between said input frequency and said reference frequency, the sense of the uniform polarity reflecting the sign of said difference.

18. The frequency difference detector of claim 17 wherein said pulse-width modulator is integrated with said transition marker.

19. The frequency difference detector of claim 17 further comprising a second flip-flop arranged to receive said input signal at one of its inputs and a phase-shifted reference signal at the other of its inputs, the output of said second flip-flop serving as a strobe control signal, said pulse strobe including a control input for receiving said strobe control signal.

* * * * *